United States Patent [19]

De Luca et al.

[11] Patent Number: 4,737,985
[45] Date of Patent: * Apr. 12, 1988

[54] DIGITAL SYSTEM CONNECT FRAME

[75] Inventors: Paul V. De Luca, Plandome Manor; Michael Shatzkin, Baldwin; Albert Atun, Valley Stream, all of N.Y.

[73] Assignee: Porta Systems Corp., Syosset, N.Y.

[*] Notice: The portion of the term of this patent subsequent to Sep. 26, 1995 has been disclaimed.

[21] Appl. No.: 925,293

[22] Filed: Oct. 31, 1986

[51] Int. Cl.$^4$ .............................................. H05K 7/18
[52] U.S. Cl. ................................. 379/327; 379/326; 379/325
[58] Field of Search ............... 379/327, 328, 330, 325, 379/326, 329; 339/18 R, 18 B, 18 C, 18 P; 361/427, 428, 429; 439/43–54

[56] References Cited

U.S. PATENT DOCUMENTS

| | | | |
|---|---|---|---|
| 3,394,287 | 7/1968 | Zitzmann et al. | 361/249 |
| 4,117,273 | 9/1978 | Gautier et al. | 379/327 |
| 4,127,748 | 11/1978 | Gillemot | 379/327 |
| 4,649,236 | 3/1987 | De Luca et al. | 379/327 |

OTHER PUBLICATIONS

Switchcraft Inc., circular #NPB 375 "DSX Jackfield".

Primary Examiner—Stewart J. Levy
Assistant Examiner—Lawrence G. Fess
Attorney, Agent, or Firm—Charles E. Temko

[57] ABSTRACT

A modular, high density cross-connect frame specifically adapted for central office application and forming a centralized distributing frame intended for patch and cross-connect circuits for digital equipment. The frame is dual-sided, with the patching and testing administration entirely on one side confined to an area readily manually and visually accessible to service personnel, with cross-connect administration confined to the opposite side. Internal connections are made using a vertically oriented cabling plane disposed between the two sides of the frame using a relatively few number of cables each having a large number of individual connectors which interconnect a first set of connector blocks with corresponding jack frame elements. A second plurality of connector blocks is disposed immediately opposite the jack frame elements, and relatively short length connectors are required to interconnect the jack frames with the second plurality of blocks. The result of this arrangement is high space utilization, permitting much higher numbers of individual circuits to be accommodated on a frame of given dimensions.

2 Claims, 3 Drawing Sheets

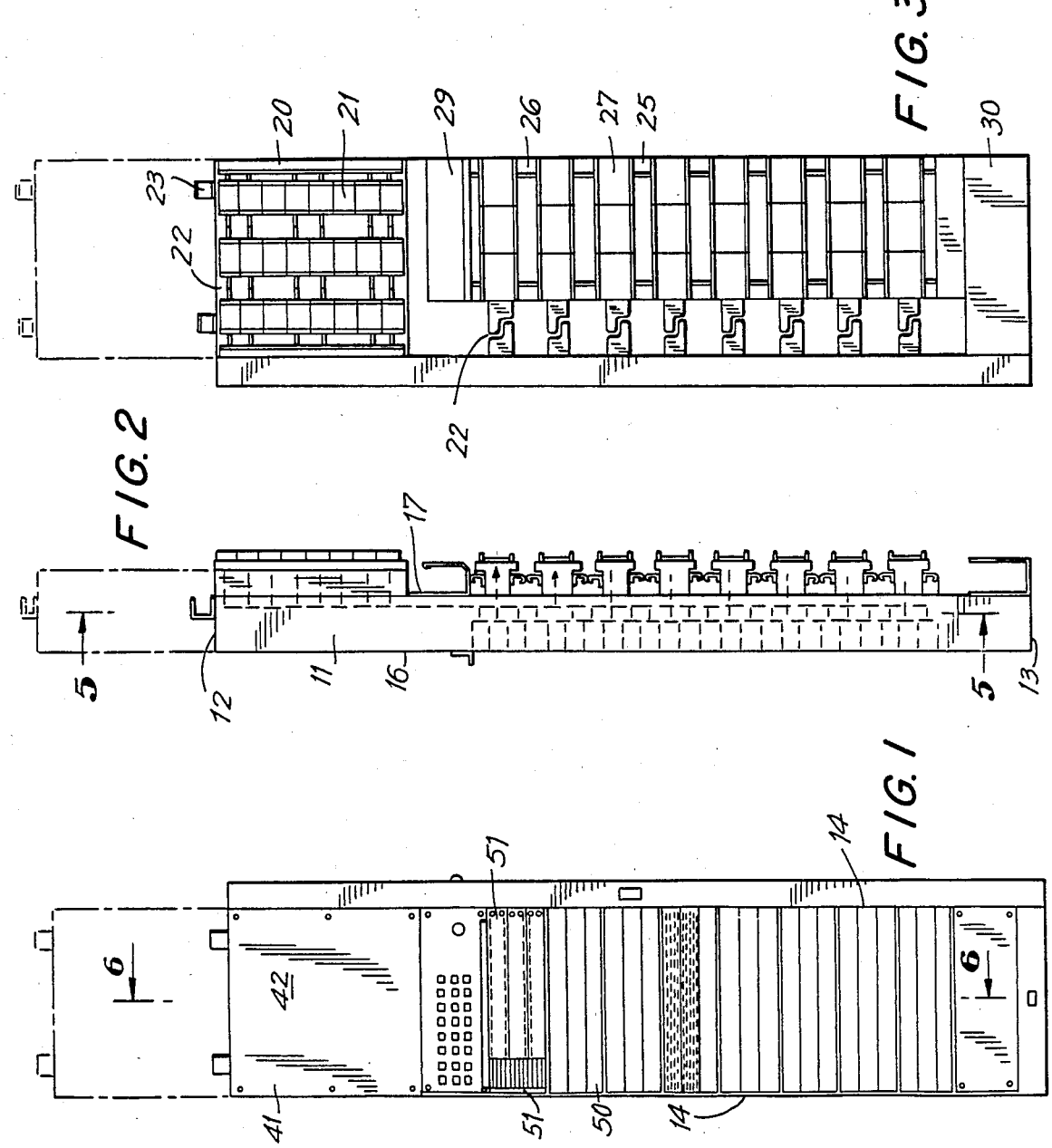

DIGITAL SYSTEM CONNECT FRAME

RELATED APPLICATION

Reference is made to copending application Ser. No. 812,632 now U.S. Pat. No. 4,649,236; filed Dec. 23, 1985 under the title Digital System Connect Frame, which is assigned to the same assignee as the present application, and which discloses and claims a related invention.

BACKGROUND OF THE INVENTION

This invention relates generally to the field of telephony, and more particularly to an improved frame construction used in the telephone central office for interconnecting individual subscriber pairs to office switching systems.

Over the last decade, old style mechanical switching systems have been replaced with solid state digital switching systems, which offer many advantages, and substantially all new installations are made on a digital switching system basis. With such installation, there has arisen a need to enable the testing and checking of such systems for proper function, which was not necessary in the case of mechanical switching systems where malfunctions could be manually observed by service personnel without making conductivity tests. While testing of an individual subscriber circuit can be done by placing test current on the subscriber line using testing equipment, or by resort to test fields on connector blocks or available at the end of protector modules, the testing of the circuits themselves has not been as readily available. Thus, when a malfunction occurs, which cannot be traced to a subscriber line, and which is believed to lie in the plant equipment area, access to such switching equipment for test purposes has not been easy, and the ability to connect other switching equipment in line pending repair has not been facilitated.

As a result of such difficulty, there has been developed a variety of connect frames including jackfields which may be interconnected using patch cords, whereby circuitry may be rerouted between inside plant and outside cables with a minimum of difficulty. These structures are useful not only for effecting digital switch cutover, but also to permit, for example, the rerouting of traffic interrupted by cut cable which can be reconnected through a third office by simple cross connections.

While such jackfield elements can be installed on almost any known main frame construction, as usual, the principal problem is that of maximum space utilization. Unfortunately, because of the large number of jack outlets, and their relatively larger size as contrasted with a wire wrap pin, the effective circuit density per unit area nowhere approaches the high density possible with modern connector block construction. If, therefore, it is desired to have a group of subscriber circuits interfaced with particular office equipment, and have all of the interconnections on a single main frame, it is apparent that conventional architecture relative to the location of the interconnecting elements must be modified. Most main frames, assuming usual building limitations, are about twelve feet high, as a result of which the upper areas are not readily accessible to service personnel without the assistance of a short ladder or a similar device. On the other hand, in the case of a frame, the function of which is to provide manually made cross connections, using state-of-the art jackfield elements, the jackfields need occupy less than forty percent of the total available area on the frame, preferably at one location, and readily accessible to service personnel without the need of resorting to a ladder or step stool.

SUMMARY OF THE INVENTION

Briefly stated, the invention contemplates the provision of an improved cross-connect telephone frame particularly suited for interconnecting digital switching systems, in which the above-described criterion has been implemented. To this end, the jackfield elements are confined to one side of a two-sided frame, utilizing the entire width of said one side, up to a height of slightly over six feet, and utilizing substantially the total space on the opposite side for connector blocks which require substantially no manual access after installation. To facilitate interconnection, the side mounting the jackfield elements is separated from the side mounting the connector blocks a distance sufficient to provide a vertically oriented internal cabling plane in which relatively large multi-conductor cables are positioned which serve to interconnect a first set of equipment blocks disposed in the upper portion of the frame with the jackfield elements. A second set of cross-connect blocks are positioned immediately opposite the jackfield elements, and relatively short conductors are employed to interconnect the jackfield elements with the cross connect blocks. Thus, the relatively long cable interconnections may be accomplished using a relatively small number of cables each having a large number of individual conductors therein which are interconnected at the upper ends with the equipment blocks, and at the lower ends with the jack panels. Since the cross-connect blocks are disposed immediately opposite the jack panel elements, the conductors interconnecting them may be relatively short in length and easily managed. As contrasted with prior art devices of this type, the net result is far greater space utilization for a given size of frame and accommodation of a far larger number of circuits.

BRIEF DESCRIPTION OF THE DRAWINGS

In the drawings, to which reference will be made in the specification, similar reference characters have been employed to designate corresponding parts throughout the several views.

FIG. 1 is a front elevational view of an embodiment of the invention.

FIG. 2 is a side elevational view thereof.

FIG. 3 is a rear elevational view thereof.

DETAILED DESCRIPTION OF THE DISCLOSED EMBODIMENT

Figure 4:
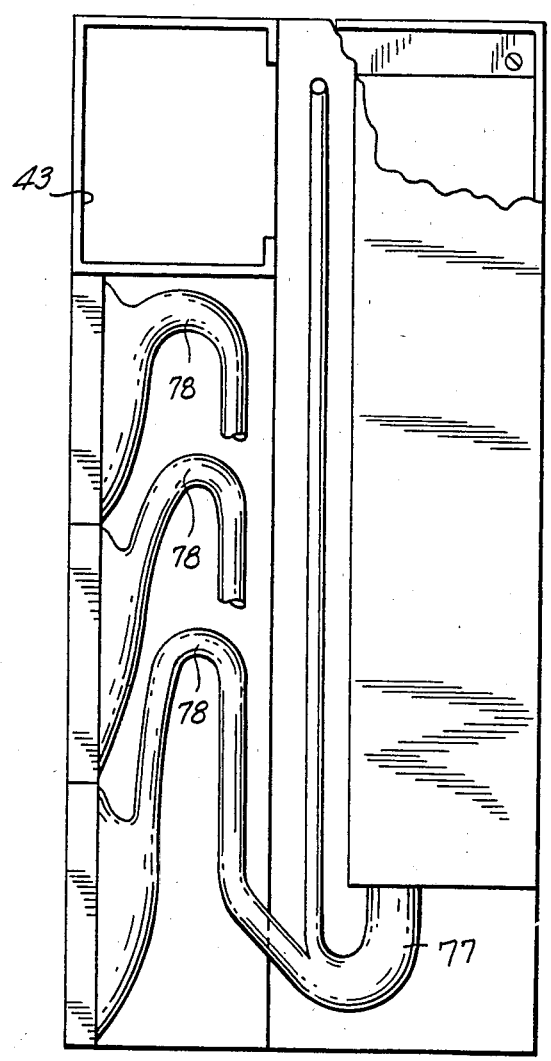
FIG. 4 is a top plan view, somewhat schematic, showing an internal cabling plane.

In accordance with the invention, the device, generally indicated by reference character 10, includes a main frame element of generally conventional metallic construction bordered by an upper edge 12, a lower edge 13, a pair of end edge surfaces 14, and defining first and second side surfaces 15 and 16, respectively, upon which equipment is mounted. While the frame element may be of any desired height and width, assuming normal telephone office space limitations, a typical frame element will be approximately nine feet high, and twenty-six inches wide, with a thickness of twelve inches.

Referring to FIG. 3 in the drawing, the side surface 15 includes an upper horizontally extending area 20 mounting a first plurality of connector blocks 21 which are serviced by a vertical trough-forming area 22 and horizontal cable rack supports 23. The blocks 21 will normally be interconnected with inside plant equipment in known fashion.

Beneath the area 21 is a lower transversely extending area 26 mounting a second plurality of connector blocks 27, and serviced by horizontal trough-forming areas 28, upper and lower horizontal troughs 29 and 30, respectively, and the above-mentioned vertical trough-forming area 22. The blocks 27 will normally be cross connect blocks associated with subscriber pairs, and are of a lower density from the standpoint of accommodating cable pairs than the blocks 21.

Referring to FIG. 1 in the drawing, the second side 16 includes a third laterally extending area 41 of configuration corresponding to that of the upper area 20, and provided with an access panel 42 overlying the vertical trough-forming means 43 (See FIG. 4).

A fourth transversely extending area 50 is positioned opposite the area 26, and mounts juxtaposed jackfield elements 51, of known type, for example, those sold under the trademark SWITCHCRAFT No. NPB 375, available from Switchcraft, Inc. of Chicago, Ill. The jacks are interconnected with any of the blocks 21 and 27, depending upon their intended function, and are, in turn, interconnected with each other using conventional patch cords (not shown).

As best seen in FIG. 1, the area 50 extends approximately three-quarters of the entire height of the frame element, so that the uppermost jackfield 51 is approximately six feet above the surface of the floor, and thus readily accessible both manually and visually to service personnel without difficulty. By placing the jackfields on only one side of the frame, the opposite side may be positioned in a less accessible location without any loss of convenience.

Figure 7:
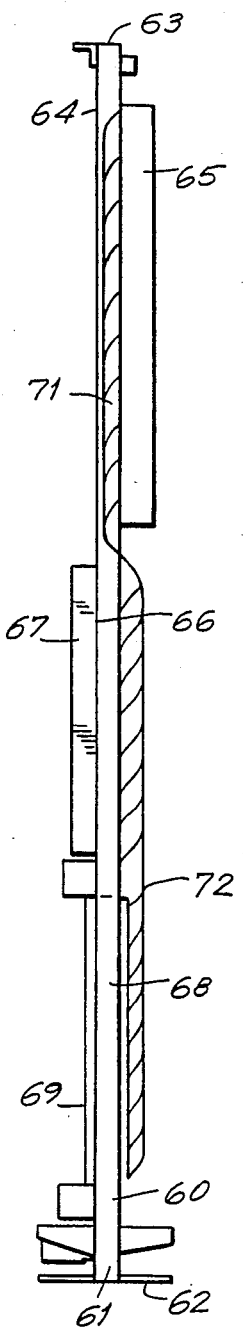
FIG. 7 is a schematic sectional view corresponding to that seen in FIG. 6, but showing a comparable prior art construction.

To enable a full appreciation of the present invention, reference is made to FIG. 7 in the drawings, which schematically illustrates a typical prior art constructon embodying a digital system interconnect frame. In this construction, a vertically oriented metallic frame element 60 includes a pair of side rails, one of which is indicated by reference character 61, which extends from a lower end 62 to an upper end 63. An upper area 64 mounts an input-output assembly 65 consisting of individual juxtaposed connector blocks (not shown). A medially disposed area 66 mounts a plurality of individual jack panels (not shown) supported on a side opposite that supporting the input-output assembly 65. Disposed beneath the jack panel assembly 67 is a lower area 68, on the same side, which mounts a cross-connect assembly 69.

Extending between the input-output assembly 65 and the jack panel 67 are a plurality of individual conductors, indicated collectively by reference character 71. These conductors may be installed at the time the frame is installed within a central telephone office, and are individually wired at that time, or can be factory wired.

In a similar manner, the jack panels are connected to the cross connect assembly using individual conductors collectively designated by reference character 72. It will be observed that at any given height of the frame, only one side of the frame is utilized, resulting in relatively low effective density for a given size frame.

Figure 5:
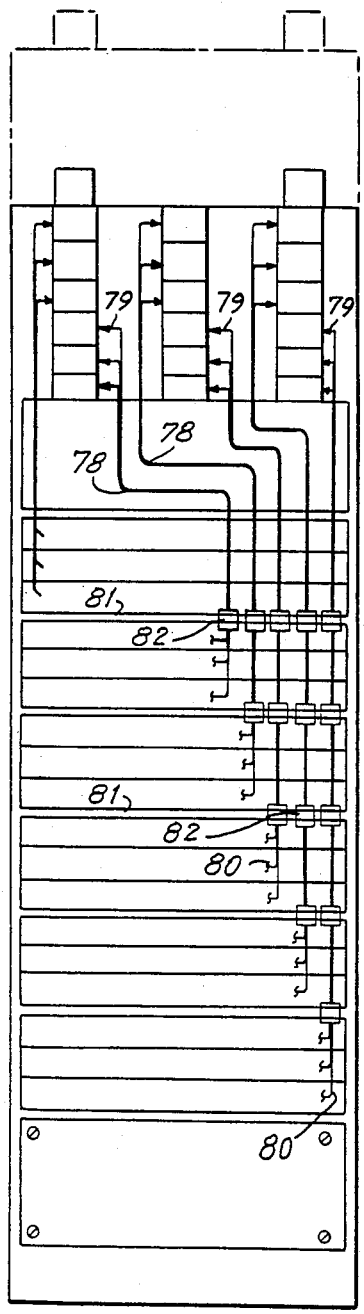
FIG. 5 is a vertical sectional view thereof as seen from the plane 5—5 in FIG. 2.
Figure 6:
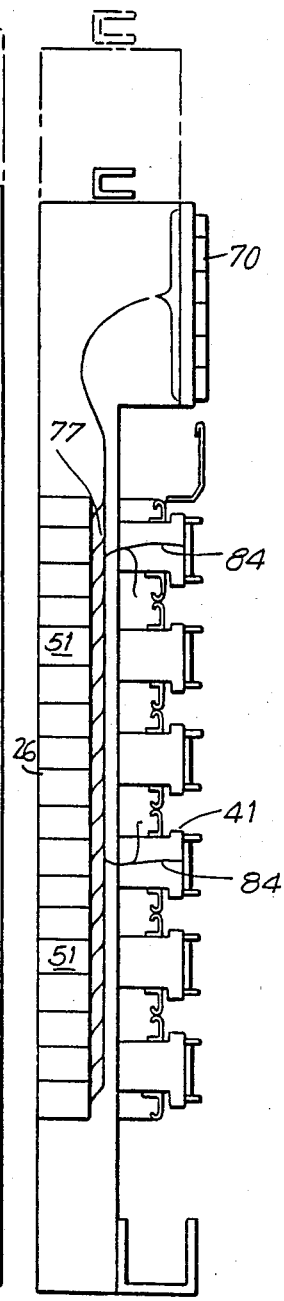
FIG. 6 is a vertical sectional view as seen from the plane 6—6 in FIG. 1.

Referring to FIGS. 5 and 6 in the drawing, the present construction may be readily compared with the prior art construction. It will be observed that the area 20 is of relatively small size, and the areas 26 and 41 are of much greater area and are disposed immediately opposite each other. Between these areas is a vertically oriented cable plane 77 which is clear of obstruction, and provides a wide interstice for interconnection of the first plurality of connector blocks 21 with the jackfield elements 51. Instead of making such interconnections on an individual basis, because of the available space, it is possible to use a relatively few number of large cables 78, each comprising many conductors, which extend from an upper end 79 to a lower end 80 within the plane 77 for this purpose. An inner surface 81 on at least some of the jackfield elements provides a support for vertically oriented rings 82 which position the cable 78 within the plane 77.

Interconnection of the jackfield elements with the second plurality of connector blocks 27 is facilitated by the fact that the jackfield elements and connector blocks are immediately opposite each other, and the individual conductors necessary to accomplish this purpose can be relatively short in length. These conductors, collectively indicated by reference character 84, can pass from the rear surfaces of the jackfield elements to the troughforming areas 28–30, and immediately to the connector blocks 27.

Typically, the disclosed embodiment will be shipped to a user in at least partially assembled condition, with the jackfields and connector blocks already installed and wired, leaving empty areas which can be utilized by the telephone company as the number of subscriber circuits required increases. The cabling plane, which extends the entire width of the device can normally accommodate all necessary additional wiring without difficulty, occasioned by the fact that much of the interconnection has been accomplished by cabling, rather than individual conductors which are both difficult to install and monitor from a bookkeeping aspect.

It may be thus be seen that we have invented novel and highly useful improvements in digital system cross-connect frames for telephone usage. As contrasted with prior art arrangements, in which the jackfields, input-output assemblies, and cross-connect assemblies are each individually mounted in nonaligned relationship to each other, it is now possible to arrange for convenient cross connection of many more individual subscriber circuits on a single frame, without either interconnecting with other frames, or utilizing excess space on a single frame.

We wish it to be understood that we do not consider the invention limited to the precise details of structure shown and set forth in this specification, for obvious modifications will occur to those skilled in the art to which the invention pertains.

We claim:

1. An improved telephone frame construction for cross-connecting digital switching systems to provide central cross-connect points comprising: a vertically oriented base frame element including first and second sides for the mounting of connecting elements; said first side defining a first upper transversely extending area, said area having a plurality of first connector blocks mounted thereon in juxtaposed relation, trough forming means adjacent said connector blocks for receiving cables from plant equipment connected with said first connector block: said first side defining a second lower transversely extending area disposed beneath said upper area, said lower area having a second plurality of connector blocks thereon, and trough forming means for receiving cross-connection cables connected with said second plurality of connector blocks; said second side of said base frame element defining a third transversely extending area of configuration corresponding to said second lower transversely extending area, and having a plurality of Jackfield elements thereon in juxtaposed relation, the individual jacks of which are connected to a connector block communicating with either equipment or crossconnection cables; whereby upon installation, said frame may be completely administered from said second side utilizing access to said Jackfields at vertical levels corresponding to said second transversely extending areas; said frame element defining a vertically oriented internal cabling plane between said first and second side; a plurality of multi-conductor cables interconnecting said first connector blocks and said Jackfield elements at upper and lower ends thereof, said cables having medially disposed portions supported within said cabling plane; and individual conductors interconnecting said Jackfield elements with said second plurality of connector blocks disposed immediately opposite said Jackfield elements.

2. An improved telephone frame in accordance with claim 1, further characterized in that said third transversely extending area extends to a vertical height of approximately three-quarters of the total height of said frame.

* * * * *